US011131698B2

(12) United States Patent
Hackl et al.

(10) Patent No.: US 11,131,698 B2
(45) Date of Patent: Sep. 28, 2021

(54) METHOD AND MONITORING DEVICE FOR SELECTIVELY DETERMINING A PARTIAL SYSTEM LEAKAGE CAPACITANCE IN AN UNGROUNDED POWER SUPPLY SYSTEM

(71) Applicant: BENDER GMBH & CO. KG, Gruenberg (DE)

(72) Inventors: Dieter Hackl, Fernwald (DE); Mario Lehr, Gruenberg (DE)

(73) Assignee: BENDER GMBH & CO. KG, Gruenberg (DE)

( * ) Notice: Subject to any disclaimer, the term of this patent is extended or adjusted under 35 U.S.C. 154(b) by 242 days.

(21) Appl. No.: 16/142,072

(22) Filed: Sep. 26, 2018

(65) Prior Publication Data

US 2019/0101581 A1  Apr. 4, 2019

(30) Foreign Application Priority Data

Sep. 29, 2017  (DE) .................... 10 2017 217 473.0

(51) Int. Cl.
*G01R 31/50* (2020.01)
*G01R 27/02* (2006.01)
(Continued)

(52) U.S. Cl.
CPC ....... *G01R 27/025* (2013.01); *G01R 27/2605* (2013.01); *G01R 31/52* (2020.01); *H02H 1/0007* (2013.01); *H02H 7/267* (2013.01)

(58) Field of Classification Search
CPC .. G01R 31/50; G01R 27/025; G01R 27/2605; H02H 1/0007; H02H 1/0015; H02H 7/267; H02H 3/105; H02H 3/16
See application file for complete search history.

(56) References Cited

U.S. PATENT DOCUMENTS 4,809,123 A * 2/1989 Allington ............... G01R 31/50
361/42
5,475,558 A * 12/1995 Barjonnet ............... G01R 31/52
361/64
(Continued)

FOREIGN PATENT DOCUMENTS

CN 202393869 U 8/2012
CN 103852643 A 6/2014
(Continued)

OTHER PUBLICATIONS

English Abstract Translation of CN203929973U dated Nov. 5, 2014.
(Continued)

*Primary Examiner* — Kyle J Moody
(74) *Attorney, Agent, or Firm* — Dickinson Wright PLLC; Andrew D. Dorisio

(57) ABSTRACT

A method and a monitoring device for selectively determining a partial system leakage capacitance in an ungrounded power supply system having a main system and at least one partial system. An extended insulation monitoring system is configured for determining an overall system leakage capacitance of the power supply system; an extended insulation fault location system for determining an ohmic and a capacitive partial test-current portion of a partial test current captured in the respective partial system; and an impedance evaluation system for determining a partial insulation resistance and a partial system leakage capacitance for each partial system to be monitored are provided. For preventing the entire ungrounded power supply system from being switched off, the fundamental idea of the present invention is advantageously based on identifying in which partial system a critical increase of a partial system leakage capacitance has taken place.

6 Claims, 4 Drawing Sheets

(51) Int. Cl.
  *G01R 27/26* (2006.01)
  *G01R 31/52* (2020.01)
  *H02H 1/00* (2006.01)
  *H02H 7/26* (2006.01)

(56) References Cited

U.S. PATENT DOCUMENTS

| | | | | |
|---|---|---|---|---|
| 2009/0323233 | A1* | 12/2009 | Shoemaker | G01R 31/005 |
| | | | | 361/42 |
| 2014/0097854 | A1* | 4/2014 | Hermeling | G01R 27/025 |
| | | | | 324/509 |
| 2015/0285850 | A1* | 10/2015 | Liu | G01R 27/025 |
| | | | | 324/551 |
| 2017/0248649 | A1* | 8/2017 | Neel | G01R 31/016 |
| 2020/0081072 | A1* | 3/2020 | Hackl | G01R 31/42 |

FOREIGN PATENT DOCUMENTS

| | | |
|---|---|---|
| CN | 203929973 U | 11/2014 |
| CN | 105759121 A | 7/2016 |
| CN | 106501669 A | 3/2017 |
| CN | 106816856 A | 6/2017 |
| CN | 106841924 A | 6/2017 |
| CN | 209746034 U | 12/2019 |
| DE | 102011050590 A1 | 11/2012 |
| DE | 102013218836 A1 | 3/2015 |
| DE | 102014201044 B3 | 3/2015 |
| DE | 102014223287 A1 | 5/2016 |
| SU | 1425561 A1 | 9/1988 |
| WO | 2015087098 A1 | 6/2015 |

OTHER PUBLICATIONS

English Abstract Translation of CN202393869U dated Aug. 22, 2012.
English Abstract Translation of CN103852643A dated Jun. 11, 2014.
English Abstract Translation of CN105759121A dated Jul. 13, 2016.
English Abstract Translation of CN106501669A dated Mar. 15, 2017.
English Abstract Translation of CN106816856A dated Jun. 9, 2017.
English Abstract Translation of CN106841924A dated Jun. 3, 2017.
English Abstract Translation of CN209746034U dated Dec. 6, 2019.
English Abstract Translation of SU1425561A1 dated Dec. 6, 2019.

* cited by examiner

METHOD AND MONITORING DEVICE FOR SELECTIVELY DETERMINING A PARTIAL SYSTEM LEAKAGE CAPACITANCE IN AN UNGROUNDED POWER SUPPLY SYSTEM

The disclosure of German Patent Application no. 10 2017 217 473.0, filed Sep. 29, 2017, is incorporated herein by reference.

TECHNICAL FIELD

The invention relates to a method and a monitoring device for selectively determining a partial system-leakage capacitance in an ungrounded power supply system which consists of a main system and at least one partial system.

When the requirements to the operational, fire and contact safety are increased, the network configuration of an ungrounded power supply system comes to use. In this network configuration, the active parts of the power supply system are separated from the ground potential—with respect to "ground"—or are connected to ground via a sufficiently high impedance. A power supply system in this form is therefore also referred to as an isolated network (French: Isolé Terre—IT) or as an IT power supply system.

BACKGROUND

An (neutral point) impedance between the active parts and ground is seen as sufficiently high if no dangerous fault currents can arise in the first fault instance, e.g. a ground fault or physical contact.

The essential advantage of the ungrounded power supply system lies in the ungrounded power supply system being able to continue in operation without a prescribed time limit even when a first fault has arisen, under the prerequisite that the insulation state is continuously monitored by an insulation monitoring system; however, it is recommended to eliminate the first fault as quickly as possible.

In order to fulfill the requirement of quickly eliminating the first fault, an insulation fault location system is generally used in extended, widely branched ungrounded power supply systems having one main system and several partial systems.

The insulation fault location system essentially consists of one test-current generator which generates a test current and feeds this test current into the ungrounded power supply system at a central location between one or more active conductors and ground as well as of several test-current sensors which are mostly configured as measuring current transformers and are disposed at the line outlets (partial systems) to be monitored in order to capture a partial test current there, said measuring current transformers being connected to a central insulation-fault evaluation device for evaluating the measuring signal.

In order to gauge whether a power supply system is actually an ungrounded or a sufficiently high-impedance power supply system, not just the constant monitoring of the insulation resistance but also the critical surveillance of the system leakage capacitances to be expected and the layout of the grounding system for grounding connected operating means.

In most applications, the surveillance of the system leakage capacitances to be expected and of the grounding system suffices in the planning phase, during initial operation and in the repeat tests.

However, there are electric installations critical to safety, such as in railroad applications, in which system leakage capacitances cannot be seen as static quantities but have to be seen as dynamic parameters which can also critically change within the test intervals via different influential factors, such as environmental influences (humidity, damage).

An exceedance of a system-leakage-capacitance threshold in conjunction with the electric properties of the present grounding system can lead to normative requirements to the electrical safety no longer being fulfilled. In these instances, the ungrounded power supply system should be automatically switched off.

This, however, contradicts the underlying concept of the ungrounded power supply system which is based on preventing the installation from being switched off when a first fault arises along with the consequence of an operational standstill.

According to the state of the art, efforts are made to confirm during the progress of the repeat tests whether a protective grounding system is still suitably configured. System leakage capacitances increased during operation, for example, can lead to the protective grounding system no longer corresponding to the operational conditions.

Unfortunately, this part of the repeat tests cannot be carried out during a running operation of the electric installation. Depending on the extension and complexity of the power supply system to be tested, a considerable time requirement and a corresponding duration of the operational standstill are to be reckoned with in this context.

Should moreover increased system leakage capacitances occur only in certain operational states, the chances of discovering this possible danger during the repeat tests are then utterly slim.

Another possible solution used in practice consists of oversizing the grounding system. The protective-conductor cross section is oversized such from the beginning that the normative requirements are fulfilled even when fluctuations of the system leakage capacitances to be expected during operation arise. Depending on the respective application, this possibility cannot be carried out in an economically feasible manner. From experience, it is problematic that neither the designer nor the operator of the electric installation is sufficiently familiar with important relevant system parameters, such as the system leakage capacitance and its fluctuation range.

SUMMARY

The objective of the present invention is therefore to present a solution by means of which a safety-critical change of a system leakage capacitance of an ungrounded power supply system can be captured without a switching off of the entire ungrounded power supply system, which would be connected to an operational standstill, being required.

This objective is attained by a method comprising the following method steps: determining an overall insulation resistance of the power supply system; determining an overall system leakage capacitance of the power supply system; continually generating and feeding a test current into the main system; capturing a partial test current in each partial system to be monitored; determining an ohmic and a capacitive partial test-current portion for each captured partial test current; determining a partial insulation resistance and a partial system leakage capacitance for each partial system to be monitored from the overall insulation resistance, from the overall system leakage capacitance, from the test current and from the ohmic and capacitive partial test-current portions; assessing the identified partial insulation resistance in regard of the partial insulation resistance falling below a partial insulation-resistance threshold; and assessing the identified partial system leakage capacitance in regard of the partial system leakage capacitance exceeding a partial system-leakage-capacitance threshold.

In regard of preventing a switching off of the entire ungrounded power supply system, the fundamental idea of the present invention is advantageously based on identifying in which partial system a critical increase of a partial system leakage capacitance has taken place.

For this purpose, an overall insulation resistance and an overall system leakage capacitance of the power supply system are continuously determined during operation by means of an extended insulation monitoring system. In addition to the actual task of insulation resistance monitoring, an overall system leakage capacitance of the power supply system is identified in the extended insulation monitoring system. This overall system leakage capacitance is consulted in a following method step (see below) for computing a partial system leakage capacitance valid for a certain partial system.

At the same time, a test-current generator continuously generates a test current and feeds it into the ungrounded power supply system at a central location between one or more active conductors and ground.

By means of test-current sensors, which are preferably realized as measuring current transformers, a partial test current is captured in each partial system to be monitored.

Complementary to a known insulation fault location device and according to the invention, the extended insulation fault location system is configured—besides the typical determination of an ohmic partial test-current portion—for determining a capacitive partial test-current portion for each identified partial test current.

In this manner, the partial test current flowing owing to the centrally supplied test current in the partial system is thus captured for each partial system to be monitored, and the ohmic partial test-current portion and the capacitive partial test-current portion are determined based on this.

In an impedance evaluation system comprising an impedance evaluation unit and an impedance assessment unit, the sizes overall insulation resistance, overall system leakage capacitance, test current and ohmic and capacitive partial test current portion are evaluated and assessed in a subsequent step in order to determine a partial insulation resistance valid for the respective partial system and a valid partial system leakage capacitance.

For this purpose, the partial insulation resistance and the partial system leakage capacitances are identified for each valid partial system to be monitored based on the signal shape of the supplied test current and its respective parameter, such as amplitude, frequency and phase (in a sine-shaped test current) or pulse duration (in a pulse-shaped square-wave test current) and from the overall insulation resistance (real part of a complex-valued overall system leakage impedance) and from the overall system leakage capacitance (imaginary part of the complex-valued overall system leakage impedance) as well as the ohmic and capacitive partial test-current portions determined from the captured partial test current under application of Ohm's Law and the relations between current and voltage (current divider rule) valid in linear systems.

In the impedance assessment unit, the identified partial insulation resistance is subsequently assessed in regard of the partial insulation resistance falling below a partial insulation-resistance threshold and the identified partial system leakage capacitance is assessed in regard of the partial system leakage capacitance exceeding a partial system-leakage-capacitance threshold. Recognizing when a value has been exceeded/fallen below is connected to the task of issuing an alarm message for the respective partial system (s).

This approach ensures a temporally continuously monitored operation of the ungrounded power supply system in regard of the safety-critical change of electric parameters, in particular the insulation resistance and the system leakage capacitance.

The method according to the invention enables a selective, foresighted and thus predictive maintenance of the ungrounded power supply system adapted to each partial system.

Already during operation of the electric installation, the cable sections (partial systems) can be determined by means of a critical increase of the partial system leakage capacitance and thus the partial systems urgently requiring maintenance can be assigned to available, usually limited, maintenance budgets.

By not applying the method according to the invention, the entire electric installation would have to be taken offline when a critical overall leakage capacitance has been confirmed (solely at a specific time) and all partial systems would have to be separated and measured individually. On the one hand, such an approach is expensive and time intensive and on the other hand, it cannot be carried in the different applications which require an availability of 100%.

Moreover, the method according to the invention provides the technical requirements for selectively switching off critically assessed partial systems so that the operation of the remaining parts of the electric installation, which have not been assessed as being critical, can be continued to be operated without hindrances.

In another embodiment, the partial system is switched off, for which it has been confirmed that the partial insulation-resistance threshold has been fallen below or that the partial system-leakage-capacitance threshold has been exceeded.

If one or more partial systems are identified as being critical due to a fallen-below partial insulation-resistance threshold or an exceeded partial system-leakage-capacitance threshold, then the respective partial system(s) is/are switched off. All other installation parts are not affected by this partial-system-selective switching off selecting the partial system(s) and can continue unhindered in their operation.

The test current can comprise a sine-shaped progress, the ohmic and the capacitive partial test-current portions in the partial system being determined by means of evaluating the phase of the partial test current.

Alternatively, the test current can have a square-wave progress, the ohmic and the capacitive partial test-current portion in the partial system being determined by evaluating temporally consecutive signal sections of the partial test current, amplitude progresses of settling processes of settled states of the partial test current being evaluated.

In dependence on the signal shape of the generated test current, different methods are consulted for determining the ohmic and the capacitive partial test-current portion.

In the instance of a sine-shaped test current, the captured partial test current can be seen as a complex-valued quantity with the ohmic partial test-current portion as a real part and with the capacitive partial test-current portion as an imaginary part. The capacitive partial test-current portion is thus yielded as a function of the phase shift with respect to the supplied test current.

In the instance of a square-wave test current, the amplitude progresses of temporally consecutive signal portions, i.e. of settling processes and settled states directly following, of the captured partial test current are evaluated.

The evaluation can be carried out in the time domain or, after a respective signal transformation, in the frequency level.

In carrying out the method according to the invention, the objective is further attained by a monitoring device for selectively determining a partial system leakage capacitance in an ungrounded power supply system which consists of a main system and at least one partial system, said monitoring device comprising the following according to the invention: an extended insulation monitoring system which is configured for determining an overall insulation resistance and an overall system leakage capacitance of the power supply system; an extended insulation fault location system; a test-current generator for continuously generating and feeding a test current into the main system, having test-current sensors for capturing a partial test current in each partial system to be monitored and having an insulation-fault evaluation device to which the test-current sensors are connected; said extended insulation fault location system being configured for determining an ohmic and a capacitive partial test-current portion for each captured partial test current and said monitoring device further comprising an impedance evaluation system which comprises an impedance evaluation unit for determining a partial insulation resistance and a partial system leakage capacitance for each partial system to be monitored from the overall insulation resistance, from the overall system leakage capacitance, from the test current and from the ohmic and capacitive partial test-current portions as well as comprising an impedance assessment unit for assessing the identified partial insulation resistance in regard of the partial insulation resistance falling below a partial insulation-resistance threshold and for assessing the identified partial system leakage capacitance in regard of the identified partial system leakage capacitance exceeding a partial system-leakage-capacitance threshold.

The essential, superordinate functional units ("systems") of the monitoring device according to the invention are firstly an extended insulation monitoring system, secondly, an extended insulation fault location system comprising a test-current generator, test-current sensors and an insulation-fault evaluation device, and thirdly an impedance evaluation system comprising an impedance evaluation unit and an impedance assessment unit.

In order to continuously generate and supply a test current, an inherently available measuring-current generator of the extended insulation monitoring system can be used. In this instance, the measuring-current generator of the extended insulation monitoring system complements or substitutes the test-current generator of the extended insulation fault location system.

The functionally extended insulation monitoring system differs from insulation monitoring devices of generic make in that it is additionally configured for monitoring (determining) the overall system leakage capacitances of the ungrounded power supply system besides the typical determination of the overall insulation resistance.

In contrast to typical insulation fault location systems, which are only activated after a (first) insulation fault has arisen, the test-current generator of the extended insulation fault location system or the measuring-current generator of the extended insulation monitoring system continuously feeds a test current into the ungrounded power supply system. The extended insulation fault location system is not only configured for determining the partial test current according to magnitude (in contrast to the location systems known form the state of the art) but is also capable of determining the ohmic partial test-current portion and the capacitive partial test-current portion from the captured partial test current.

In the impedance evaluation unit, the impedance evaluation system completes the task of determining a partial insulation resistance and a partial system leakage capacitance for each partial system to be monitored from the quantities overall insulation resistance and overall system leakage capacitance (said quantities being provided by the extended insulation monitoring system), and from the quantities test current and its parameters (said quantities being provided by the extended insulation fault location system) as well as from the identified ohmic and capacitive partial test-current portions.

Ultimately, the impedance assessment unit of the impedance evaluation system has the task of assessing the partial insulation resistance and the partial system leakage capacitance and, in the instance of a threshold being fallen below or exceeded, of issuing an alarm signal for the respective partial system(s).

In another embodiment, the monitoring device comprises a controlling and switching-off device which is configured for switching off the partial system for which it has been confirmed that the partial insulation resistance has fallen below the partial insulation-resistance threshold or that the system leakage capacitance has exceeded the partial system leakage capacitance threshold.

Should the impedance assessment unit have assessed a partial system as being critical due to a too low partial insulation resistance or a too high partial system leakage capacitance, a controlling and switching-off device switches off the respective partial system (or several partial systems identified as being critical). In this context, partial-system switching-off devices, which are dispersed in the partial systems, are controlled according to alarm messages generated by the impedance assessment unit.

BRIEF DESCRIPTION OF THE DRAWINGS

Further advantageous features of embodiments can be derived from the following description and the drawings which describe a preferred embodiment of the invention by means of examples. In the following.

DETAILED DESCRIPTION

Figure 1:
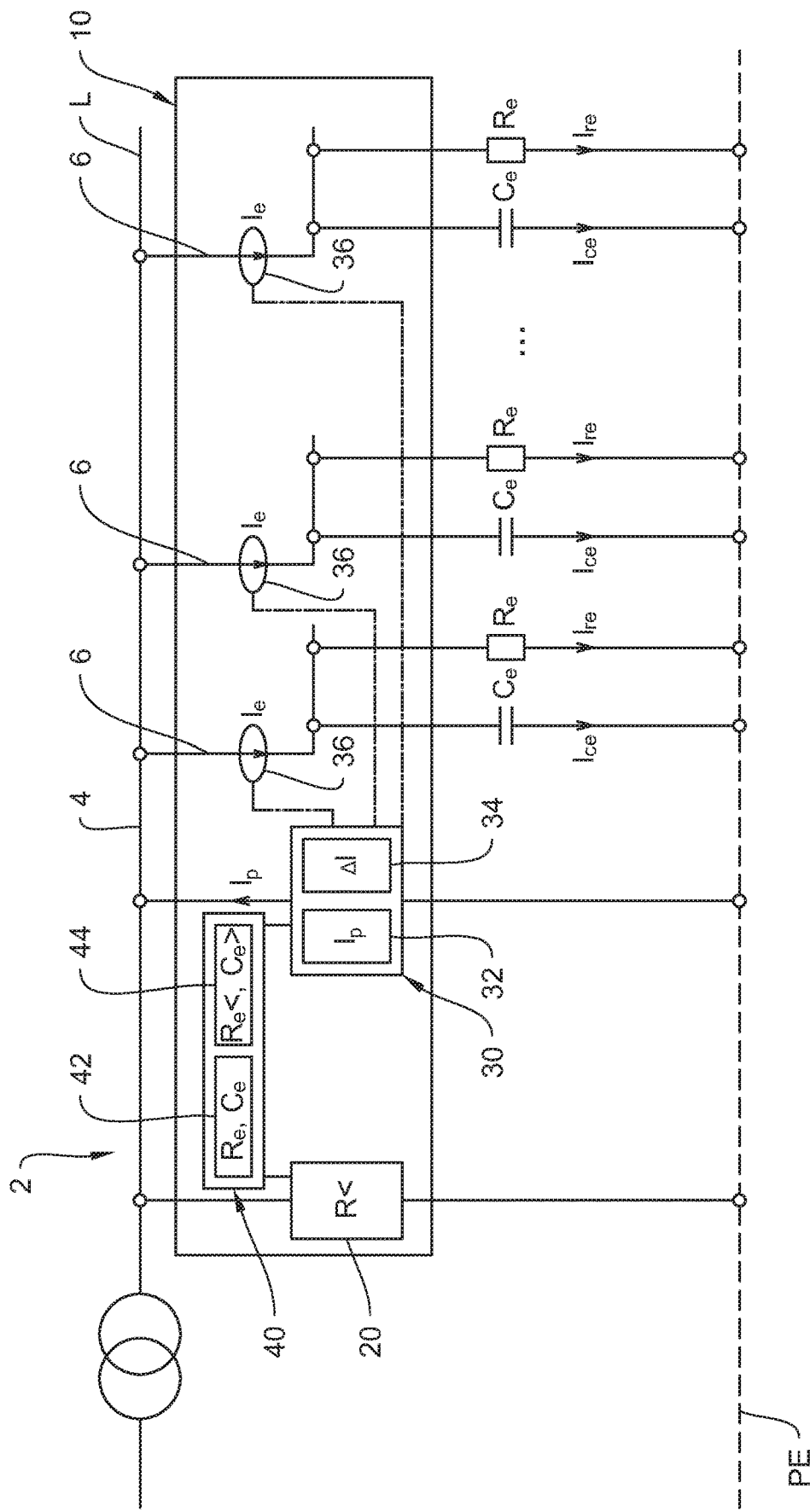
FIG. 1 illustrates an ungrounded power supply system having the monitoring device according to the invention.

In FIG. 1, an ungrounded power supply system 2 is illustrated having a monitoring device 10 according to the invention. The power supply system 2 consists of a main system 4 and n partial systems 6. The partial systems 6 are each characterized by a partial insulation resistance Re and a partial system leakage capacitance Ce; the leakage impedance of the main system 4 is neglected in the present illustration and the partial insulation resistances Re and the partial system leakage capacitances Ce are different for the partial systems 6 in practice.

The monitoring device 10 comprises an extended insulation monitoring system 20, an extended insulation fault location system 30 and an impedance evaluation system 40 as superordinate functional units.

The extended insulation monitoring system 20 is switched between at least one active conductor L of the main system 4 and ground PE and monitors an overall insulation resistance Reges of the power supply system 2. The overall insulation resistance Reges is yielded from the parallel circuit of all partial insulation resistances Re present in the power supply system and corresponds to the inverse of the summed-up partial insulation conductance 1/Re. As an additional function, the extended insulation monitoring system 20 determines an overall system leakage capacitance Ceges of the power supply system 2. This overall system leakage capacitance Ceges is realized via the parallel circuit of all partial system leakage capacitances Ce and corresponds to the sum of the partial system leakage capacitances Ce.

The extended insulation fault location 30 comprises a test-current generator 32 which is switched between at least one active conductor L of the main system 4 and ground PE in the same manner as the extended monitoring system 20 and continuously feeds a test current Ip into the main system 4. In the illustrated exemplary embodiment, the test-current generator 32 is constructively assigned to the extended insulation fault location system 30. In order to continuously generate and supply the test current Ip, a measuring-current generator of the extended insulation monitoring system 20 can also be used in the function of the test-current generator 32.

This test current Ip is captured by the test-current sensors 36, which are disposed in the partial systems 6, as a partial test current Ie, the magnitude of the captured partial test current Ie in the respective partial system 6 depending on the partial insulation resistance Re and the partial system leakage capacitance Ce of the respective partial system 6. The test-current sensors 36 are connected to an insulation-fault evaluation device 34 of the extended insulation fault location system 30 in order to evaluate the measuring signals.

The captured partial test current Ie of each partial system 6 can be divided into an ohmic partial test-current portion Ire flowing via the partial insulation resistance Re and into a capacitive partial test-current portion Ice flowing via the partial system leakage capacitance Ce. The extended insulation fault location system 30 is thus configured such that not only the ohmic test-current portion Ire can be determined but also the capacitive partial test-current portion Ice can be determined.

The impedance evaluation system 40 comprises an impedance evaluation unit 42 for determining the partial insulation resistance Re and the partial system leakage capacitance Ce for each partial system 6 to be monitored. Besides the test current Ip, the overall insulation resistance Reges identified by the extended insulation monitoring system 20 and the identified overall system leakage capacitance Ceges as well as the ohmic partial test-current portion Ire identified by the extended insulation fault location system 30 and the capacitive partial test-current portion Ice are included in the computation of the partial insulation resistance Re and the partial system leakage capacitance Ce (cf. FIG. 4).

Furthermore, the impedance evaluation system 40 comprises an impedance assessment unit 44, in which the quantities partial insulation resistance Re and partial system leakage capacitance Ce, which are computed in the impedance evaluation unit 42, are subjected to an assessment for each partial system 6 to be monitored in regard of the falling below (Re) or exceedance (Ce) of a threshold. If a falling-below or an exceedance is established, then this state is classified as being critical and an alarm message 46 (FIG. 4) for the respective partial system 6 follows.

Figure 2:
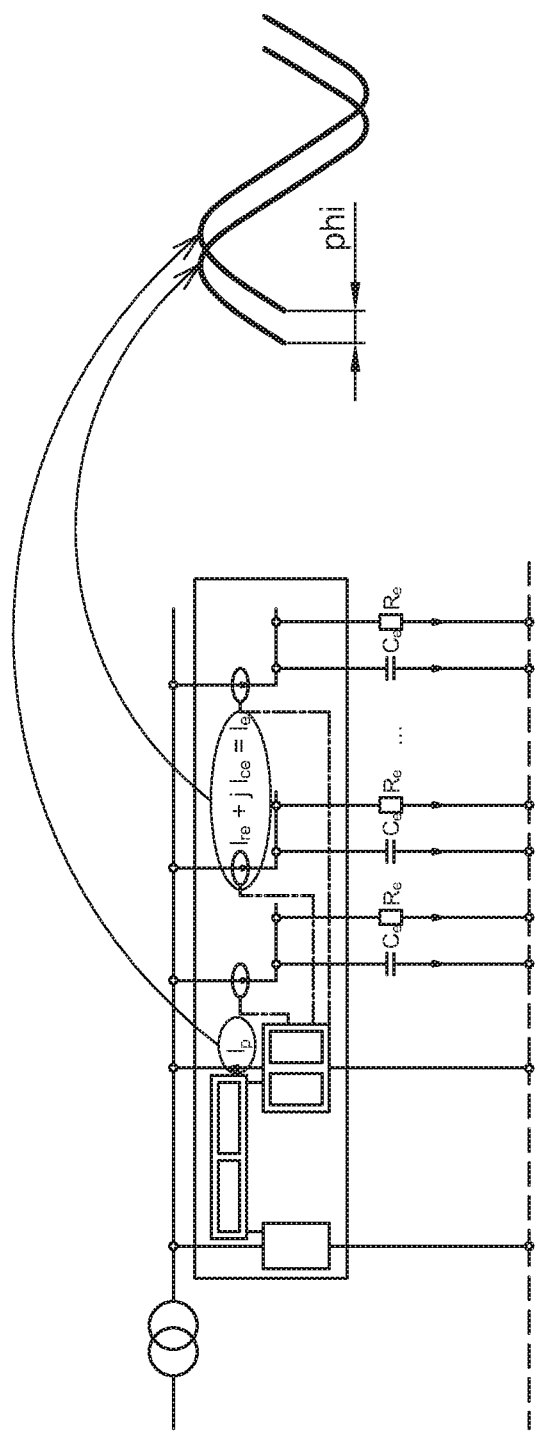
FIG. 2 illustrates the phase evaluation of a partial test current when supplying a sine-shaped test current.

In FIG. 2, the phase evaluation carried out in the extended insulation fault location system 30 illustrates a captured partial test current Ie for identifying the ohmic and the capacitive partial test-current portion Ire, Ice when supplying a sine-shaped test current Ip. With the phase position of the test current Ip as a reference phase, the size of the capacitive partial test-current portion Ice can be determined as the function of the phase angle phi.

Figure 3:
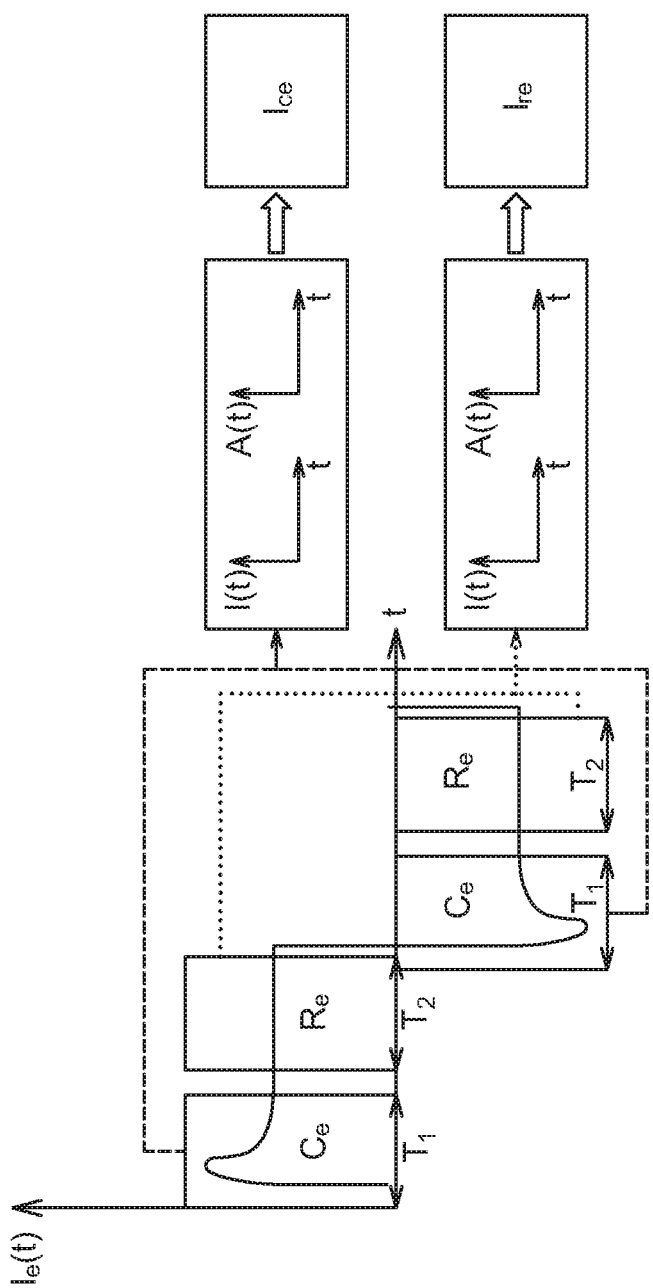
FIG. 3 illustrates evaluating the temporal progress of a partial test current when supplying a square-wave test current.

FIG. 3 illustrates the evaluation, which is carried out in the extended insulation fault location system 30, of the temporal progress of a captured partial test current Ie for identifying the ohmic and the capacitive partial test-current portion Ire, Ice when supplying a square-wave test current Ip. The amplitude progress in a settling phase T1 of the partial test current Ie is analyzed regarding the parameters, such as rise time, settling time or maximal overshooting, and based on this, the magnitude of the capacitive partial test-current portion Ice can be concluded. In order to eliminate random interfering influences as much as possible, several settling processes are observed.

Analogously, amplitude progresses of settled states T2 are evaluated in order to be able to determine the ohmic partial test-current portion Ire after the capacitive partial test-current portion Ice has settled.

Figure 4:
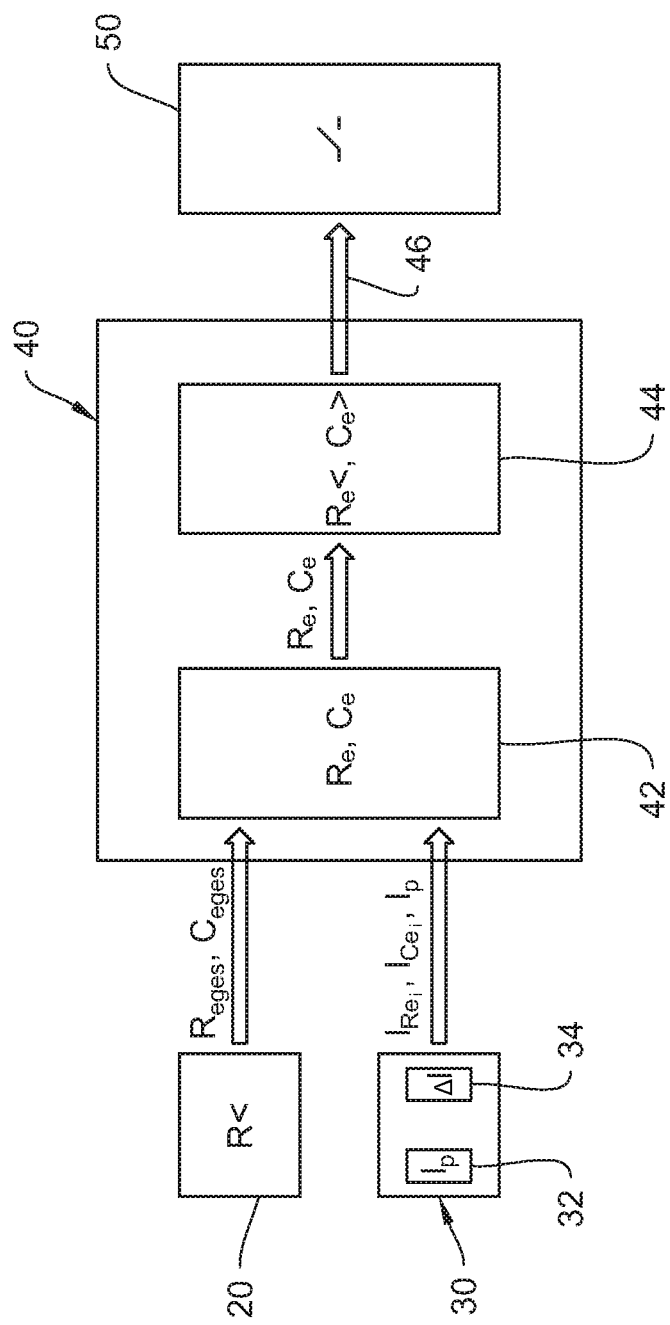
FIG. 4 illustrates the general method procedure in a functional block diagram of the monitoring device according to the invention.

In FIG. 4, the general method procedure is illustrated in a functional block switching diagram of the monitoring device 10 according to the invention.

The extended insulation monitoring system 20 provides the overall insulation resistance Reges and the overall system leakage capacitance Ceges; the extended insulation fault location system 30 provides the test current Ip, the ohmic partial test-current portion Ire and the capacitive partial test-current portion Ice. From these quantities, the evaluation unit 42 of the impedance evaluation system 40 computes the partial insulation resistance Re and the partial system leakage capacitance Ce for each partial system 6 to be monitored. The assessment unit 44 of the impedance evaluation system 40 assesses the partial insulation resistance Re and the partial system leakage capacitance Ce on whether a critical state is present due to a fallen-below partial insulation-resistance threshold or an exceeded partial system-leakage-capacitance threshold and issues an alarm message 46 for the respective partial system 6.

Via an optional controlling and switching-off device 50, the critical partial system 6 can be switched corresponding to the alarm message 46 generated by the assessment unit 44 of the impedance evaluation system 40.

The invention claimed is:

1. A method for selectively determining a leakage capacitance (Ce) of at least one partial system (6) in an ungrounded power supply system (2) having a main system (4) and a plurality of partial systems (6), comprising the method steps:
   determining an overall insulation resistance (Reges) of the power supply system (2),
   determining an overall system leakage capacitance (Ceges) of the ungrounded power supply system (2),
   continuously generating and supplying a test current (Ip) to the main system (4),
   capturing a partial test current (Ie) in the at least one partial system (6) being monitored, determining an ohmic and a capacitive partial test current portion (Ire, Ice) as real and imaginary parts for each captured complex-valued partial test current ($I_e$), determining a partial insulation resistance (Re) and a partial system leakage capacitance (Ce) for the at least one partial system (6) being monitored from the overall insulation resistance (Reges), from the overall system leakage capacitance (Ceges), from the test current (Ip) and from the ohmic and capacitive partial test current portions (Ire, Ice), evaluating the identified partial insulation resistance (Re) in regard of the partial insulation resistance (Re) falling below a partial-insulation-resistance threshold and evaluating the identified partial system leakage capacitance (Ce) in regard of the partial system leakage capacitance (Ce) exceeding a partial-system-leakage-capacitance threshold.

2. The method according to claim 1, characterized in that the at least one partial system (6) being monitored is switched off, for which it has been confirmed that the partial insulation resistance (Re) has fallen below the partial-insulation-resistance threshold or for which it has been confirmed that the partial system leakage capacitance (Ce) has exceeded the partial-system-leakage capacitance threshold.

3. The method according to claim 1, characterized in that the test current (Ip) has a sine-shaped progress and in that the ohmic and the capacitive partial test-current portion (Ire, Ice) in the at least one partial system (6) being monitored is determined by means of evaluating the phase of the partial test current (Ie).

4. The method according to claim 1, characterized in that the test current (Ip) has a square-wave progress and in that the ohmic and the capacitive partial test-current portion (Ire, Ice) in the at least one partial system (6) being monitored is determined by evaluating temporally consecutive signal sections of the partial test current, amplitude progresses of settling times (T1) and of settled states (T2) of the partial test current (Ie) being evaluated.

5. A monitoring device (10) for selectively determining a partial system leakage capacitance (Ce) in an ungrounded power supply system (2) which comprises a main system (4) and a plurality of partial systems (6), comprising an extended insulation monitoring system (20) which is configured for determining an overall insulation resistance (Reges) and an overall system leakage capacitance (Ceges) of the power supply system (2); an extended insulation fault location system (30); a test-current generator (32) for continuously generating and feeding a test current (Ip) into the main system (4), having test-current sensors (36) for capturing a partial test current (Ie) in at least one partial system (6) being monitored and having an insulation-fault evaluation device (34) to which the test-current sensors (36) are connected; said extended insulation fault location system (30) being configured for determining an ohmic and a capacitive partial test-current portion (Ire, Ice) as real and imaginary parts for each captured complex-valued partial test current (Ie) and said monitoring device (10) further comprising an impedance evaluation system (40) which comprises an impedance evaluation unit (42) for determining a partial insulation resistance (Re) and a partial system leakage capacitance (Ce) for each partial system (6) to be monitored from the overall insulation resistance (Reges), from the overall system leakage capacitance (Ceges), from the test current (Ip) and from the ohmic and capacitive partial test-current portions (Ire, Ice) as well as comprising an impedance assessment unit (44) for assessing the identified partial insulation resistance (Re) in regard of the partial insulation resistance falling below a partial insulation-resistance threshold and for assessing the identified partial system leakage capacitance (Ce) in regard of the identified partial system leakage capacitance exceeding a partial system-leakage-capacitance threshold.

6. The monitoring device (10) according to claim 5, characterized by a controlling and switching-off device (50) which is configured for switching off the at least one partial system (6) for which it has been confirmed that the partial insulation resistance has fallen below the partial insulation-resistance threshold or that the partial system leakage capacitance has exceeded the partial system-leakage-capacitance threshold.

* * * * *